US007515085B2

(12) United States Patent
Bore et al.

(10) Patent No.: US 7,515,085 B2
(45) Date of Patent: Apr. 7, 2009

(54) ELECTRONIC NETWORK CIRCUIT WITH DISSYMMETRICAL DIFFERENTIAL PAIRS

(75) Inventors: Francois Bore, Grenoble (FR); Sandrine Bruel, Grenoble (FR); Marc Wingender, Saint Egreve (FR)

(73) Assignee: E2V Semiconductors (FR)

( * ) Notice: Subject to any disclaimer, the term of this patent is extended or adjusted under 35 U.S.C. 154(b) by 0 days.

(21) Appl. No.: 11/994,183

(22) PCT Filed: Jun. 23, 2006

(86) PCT No.: PCT/EP2006/063518
§ 371 (c)(1),
(2), (4) Date: Mar. 14, 2008

(87) PCT Pub. No.: WO2007/000423
PCT Pub. Date: Jan. 4, 2007

(65) Prior Publication Data
US 2008/0211705 A1 Sep. 4, 2008

(30) Foreign Application Priority Data
Jun. 28, 2005 (FR) .................................. 05 06564

(51) Int. Cl.
H03M 1/36 (2006.01)
(52) U.S. Cl. ................... 341/159; 341/133; 341/134; 341/135; 341/155; 341/158
(58) Field of Classification Search ................. 341/133, 341/134, 135, 155, 156, 158, 159
See application file for complete search history.

(56) References Cited
U.S. PATENT DOCUMENTS 4,379,268 A    4/1983   Nagata
5,376,937 A   12/1994   Colleran et al.
5,392,045 A *  2/1995   Yee ............................. 341/156
5,416,484 A    5/1995   Lofstrom
5,489,904 A *  2/1996   Hadidi ........................ 341/156
5,548,287 A *  8/1996   Gendai ........................ 341/133
5,550,492 A *  8/1996   Murden ........................ 327/65
5,554,943 A *  9/1996   Moreland ...................... 327/65
5,706,008 A *  1/1998   Huntley et al. ............... 341/156
5,721,548 A *  2/1998   Choe et al. ................... 341/118
6,392,448 B1*  5/2002   Vadipour ...................... 327/51
6,579,303 B2*  6/2003   Amplatz ....................... 606/200
7,154,421 B2* 12/2006   Devendorf et al. ........... 341/118
7,277,041 B2* 10/2007   Scholtens .................... 341/159
7,420,497 B2*  9/2008   Chiu .......................... 341/155
2007/0069928 A1* 3/2007   Gehring et al. ............. 341/118

FOREIGN PATENT DOCUMENTS
GB         2195211 A       3/1988

* cited by examiner

Primary Examiner—Linh V Nguyen
(74) Attorney, Agent, or Firm—Lowe Hauptman Ham & Berner, LLP

(57) ABSTRACT

The invention relates to integrated circuits comprising a set of identical differential pairs of two transistors each (T1, T2; T3, T4) one receiving a variable voltage (Vinp, Vinn) at its base and the other receiving a fixed reference voltage (Vrefp, Vrefn). In order to reduce the dispersion of the offset voltages of said differential pairs, it is provided that the transistor (T2, T4) that receives a fixed reference voltage has an emitter surface at least twice as large as the transistor (T1, T3) that receives a variable voltage at its base. Application to signal folding circuits and to analog-to-digital converters using differential pairs of transistors.

14 Claims, 2 Drawing Sheets

US 7,515,085 B2

ELECTRONIC NETWORK CIRCUIT WITH DISSYMMETRICAL DIFFERENTIAL PAIRS

CROSS-REFERENCE TO RELATED APPLICATIONS

The present application is based on International Application No. PCT/EP2006/063518 filed on Jun. 23, 2006, which in turn corresponds to French Application No. 05 06564 filed on Jun. 28, 2005, and priority is hereby claimed under 35 USC §119 based on these applications. Each of these applications are hereby incorporated by reference in their entirety into the present application.

FIELD OF THE INVENTION

The invention relates to transistorized electronic circuits, and more particularly analog circuits that use sets of several differential pairs of transistors for their operation.

BACKGROUND OF THE INVENTION

Here "differential pair of transistors means a set of two parallel branches each comprising a transistor having an emitter, a base and a collector, the emitters being joined together and powered by a common current source such that the current from the source can only be shared between the two transistors. The bases of the transistors receive different electrical voltages and it is the difference between these voltages that adjusts the proportions of this sharing. The current source is further connected to a first power supply terminal. The collectors of the transistors are connected, directly or indirectly, to another supply terminal.

In all that follows the generic terminology transistor emitter, base and collector will be used (terms generally used for bipolar transistors), even if the transistors are field effect transistors (MOS transistors). In the latter case, the words emitter, base and collector should be taken to mean source, grid and drain respectively (terminology generally used for MOS transistors); the invention is applicable to MOS transistor circuits in the same way as to bipolar transistor circuits.

Typical applications in which a network of several differential pairs of transistors are met and to which the invention is applicable, are the following:

analog-to-digital conversion circuits with multiple comparators, in which each comparator comprises a differential pair receiving a voltage to be converted as an input on the one hand and a reference voltage on the other;

analog-to-digital conversion circuits with folding circuits, in which a folding stage comprises several folding cells each consisting of at least one differential pair, the current outputs of the cells being connected to one another for establishing a voltage or an analog output current that varies in a bell shape or sinusoidally according to the input voltage to be converted, the different cells each receiving the input voltage and a respective reference voltage.

It is recalled that the base-emitter voltage of a bipolar transistor (at a temperature assumed to be constant) is proportional to the logarithm of the current that flows through the emitter; and the current that flows through the emitter for a given base-emitter voltage is proportional to the effective surface of the emitter; accordingly, two identical transistors of a pair are, at least in theory, traversed by the same current when their bases are brought to the same potential.

Analog conversion circuits are based on this property for establishing a precise conversion; the application of the same voltage to be converted and several different reference voltages to several differential pairs can be used to set the voltage to be converted very precisely in relation to the various reference voltages.

In precision analog circuits using several differential pairs, it is noticed, however, that operating inaccuracies (particularly inaccuracies of conversion) can result from the fact that the emitter-base voltages of the different transistors of these pairs are not exactly identical even when they are traversed by identical currents.

This is because the technologies are not perfect and two transistors manufactured simultaneously, having at least theoretically the same emitter surfaces, and even placed side by side in an integrated circuit and therefore having every chance of being identical, do not have strictly identical characteristics. Consequently, for the same base-emitter voltage of the two transistors in a differential pair, the emitters are not traversed by exactly the same current. Or reciprocally, a slight offset voltage (called the offset voltage of the differential pair) must be applied between the two bases (the emitters being assumed to be joined) for them to be effectively traversed by the same current.

This results in an inevitable dispersion of production. In addition, due to the very fact of this dispersion, the different differential pairs of an integrated circuit inevitably present different offset voltages from one another.

Within the set of differential pairs of the same multiple pair circuit can be observed a dispersion of offset voltages that responds to statistical laws, typically a Gaussian one whose standard deviation is inversely proportional to the square root of the effective surface of the transistor's emitter. In fact, it is found that the dispersion is greater for small transistors and smaller for large transistors.

It is therefore known that larger transistors should be used to improve the statistics for matching differential pairs and ending up with a greater accuracy of conversion. But then the capacitances are larger and the circuits are therefore slower, which is not desirable in applications such as fast analog-to-digital converters. For the latter, it would be better to have smaller transistors in the differential pairs.

It is therefore hard to reconcile both of these two characteristics of accuracy and speed which are nevertheless essential in circuits such as analog-to-digital converters.

SUMMARY OF THE INVENTION

The invention is aimed at finding a better compromise between accuracy and speed by providing an analog-to-digital converter structure having a smaller dispersion of differential pair offset voltages, without reducing speed performance too much.

For this, the invention provides an analog-to-digital converter comprising a dual differential pair composed of two identical single differential pairs of two transistors each, the dual differential pair receiving a differential input signal which is the difference between a first and a second variable voltage (Vinp, Vinn) each applied respectively to a first respective transistor of each single pair, and further receiving a fixed reference signal (Vrefp, Vrefn) applied to a second respective transistor of each single differential pair, each single pair being powered by a respective current source connected to the emitters of the two transistors of the pair in such a way that the current from the source is shared between the emitters of the pair's transistors, characterized in that for each of the two differential pairs, the transistor that receives a fixed reference voltage has an emitter surface at least twice as large as the transistor that receives a variable voltage at its base.

The transistor that receives a fixed reference voltage preferably has an effective emitter surface double that of the other and accordingly it preferably consists of two transistors in parallel, identical to the transistor that receives the variable voltage.

The fixed reference signal is preferably itself a differential signal, which is the difference between two fixed reference voltages Vrefp and Vrefn applied respectively to the base of the second transistor of each pair.

This arrangement results in
just a small transistor being needed on the side that receives the variable voltage; it can therefore be fast; the largest transistor receives a fixed voltage and it does not matter much that its input capacitance is greater since its input voltage does not vary;
the standard deviation σ of the offset dispersion of a group of transistors which includes transistors having a Gaussian dispersion of standard deviation σ1 (small transistors) and transistors having a Gaussian dispersion of standard deviation σ2 (large transistors) is the square root of the half-sum of the squares of the standard deviations. This standard deviation σ is intermediate between the standard deviations σ1 and σ2, which is more favorable than if it were the standard deviation σ1 of small transistors.

Thus there has been a gain in dispersion, and therefore in accuracy, without practically losing speed.

The invention is particularly useful for producing converters that comprise a set of dual differential pairs, i.e. pairs each comprising two single differential pairs (with two transistors) as previously defined.

The dual differential pair receives a differential input signal which is the difference between a first and a second variable voltage, each applied respectively to one of the single pairs, and it further receives a differential reference signal which is the difference between two reference voltages each applied respectively to one of the single differential pairs.

The invention applies especially to analog converters using signal folding circuits or dual differential pair comparators.

Still other advantages of embodiments according to the present invention will become readily apparent to those skilled in the art from the following detailed description, wherein the preferred embodiments of the invention are shown and described, simply by way of illustration of the best mode contemplated of carrying out the invention. As will be realized, the invention is capable of other and different embodiments, and its several details are capable of modifications in various obvious respects, all without departing from the invention.

BRIEF DESCRIPTION OF THE DRAWINGS

The present invention is illustrated by way of example, and not by limitation, in the figures of the accompanying drawings, wherein elements having the same reference numeral designations represent like elements throughout and wherein.

DETAILED DESCRIPTION OF THE INVENTION

Figure 1:
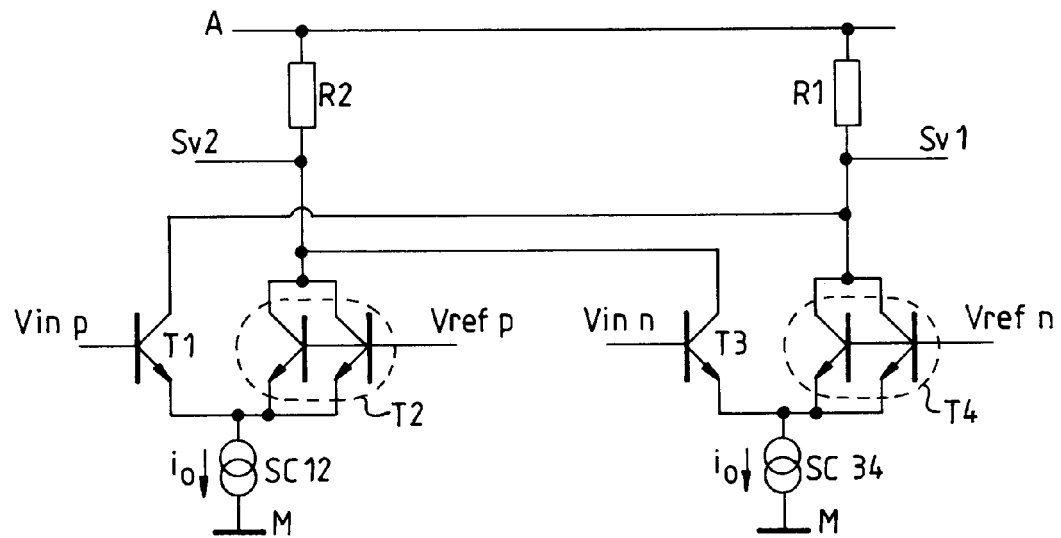
FIG. 1 represents a dual differential pair according to the invention.

FIG. 1 represents an example of a differential pair according to the invention, forming part of a multiple differential pair analog-to-digital converter.

The differential pair is a dual differential pair comprising four transistors T1, T2, T3, T4 arranged in two single differential pairs T1, T2 and T3, T4.

The single pair T1, T2 receives a variable input voltage Vinp at the base of the transistor T1 and a fixed reference voltage Vrefp at the base of the transistor T2. Similarly, the single pair T3, T4 receives a variable input voltage Vinn at the base of the transistor T3 and a fixed reference voltage Vrefn at the base of the transistor T4. The emitters of T1 and T2 are connected to the same current source SC12 of value $i_0$ further connected to a common ground M, and the emitters of T3 and T4 are connected to the same source SC34 of the same value $i_0$ connected to the ground. The dual pair therefore has inputs consisting of a variable differential signal Vinp−Vinn on the one hand and a reference differential signal Vrefp−Vrefn on the other.

The collectors of the two pairs are connected crosswise: T1 collector connected to the T4 collector; T2 collector connected to the T3 collector. These two pairs of collectors constitute voltage or current outputs Sv1 and Sv2 respectively, but they may also constitute current inputs in folding circuit configurations. The first pair of collectors is loaded with a resistor R1 (or by a more complex load such as a transistor in series with a resistor) connected to a supply terminal A. Similarly, the second pair is loaded with a resistor R2 identical to R1 and connected to the same terminal A.

This dual differential cell is intended for comparing a differential input voltage Vinp−Vinn with a differential reference voltage Vrefp−Vrefn, or, if the collectors are also used as current inputs and outputs, it can be used to be connected to other similar cells so as to form a signal folding circuit producing a varying bell-shaped or sinusoidal analog voltage, according to the differential input voltage.

In the inventive cell, the transistors T2 and T4, which receive the reference voltages Vrefp and Vrefn, are larger (at least twice as large) than the transistors T1 and T3 which receive the variable voltages Vinp and Vinn. Preferably they are exactly twice as large and they are each formed of two transistors in parallel, each identical to the transistors T1 and T3. This is what has been depicted in FIG. 1.

Figure 2:
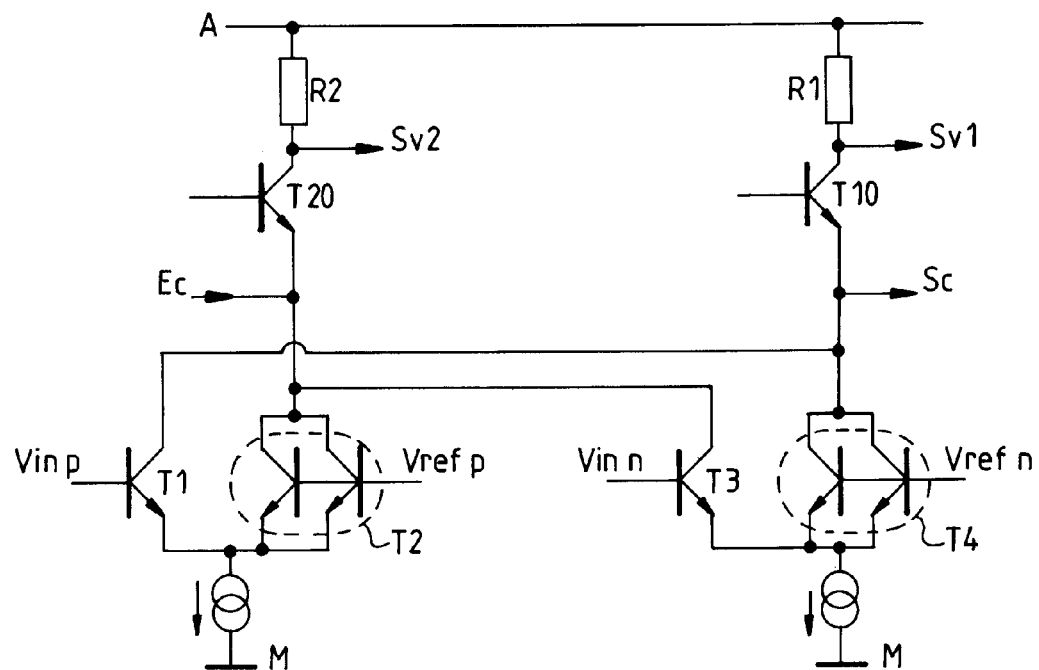
FIG. 2 represents another embodiment.

FIG. 2 shows an example of a slightly different cell, in which the collector loads are sets of one transistor and one resistor in series: T10 is in series with R1 and inserted between R1 and the collectors of T1 and T4; T20 is in series with R2 and inserted between R2 and the collectors of T2 and T3.

In a folding circuit, the collectors of T1 and T4 joined together form a current input Ec intended to be connected to the current output of a preceding cell; the collectors of T2 and T3 joined together form a current output Sc intended to be connected to the current input of a following cell.

The junction points between the transistor T10 and the resistor R1 or the transistor T20 and the resistor R2 form voltage outputs Sv1 and Sv2 if necessary.

As in FIG. 1, the transistors T2 and T4 according to the invention are dual transistors while the transistors T1 and T3 are single ones.

In a set of differential pairs, the value dispersion of base-emitter voltages for the same current in the transistors displays a standard deviation proportional to the effective surface of the emitter. Thus, if the standard deviation is σ1 for the transistors T1 and T3, then the standard deviation for the transistors T2 and T4 is $\sigma2 = \sigma1 \cdot 2^{-1/2}$.

The distribution of the offset voltages (differences in base-emitter voltage for the same current in two transistors of a pair) then presents a standard deviation that is the square root of the half-sum of the standard deviations of the two transistors. It is therefore a standard deviation $\sigma = [\sigma1^2 + \sigma1^2/2]^{1/2}$, or $(3^{1/2} \cdot \sigma1)/2$, or approximately $0.86 \cdot \sigma1$, representing a gain of 14% over the standard deviation of the dispersion. In fact, the standard deviation of the offset would be $\sigma1$ if the transistors T1 and T2 were identical.

If the transistors T2 and T4 were three times larger than T1 and T3, there would be a further gain in standard deviation, which would become $0.82 \cdot \sigma1$, but the resulting additional gain is not very great and it is preferable, for reasons of spatial dimensions in any case, not to further enlarge the transistors T2 and T4.

It will be noted that the imbalance of the transistors T1 and T2 according to the invention ends up in an offset systematically not zero since an identical voltage at the two bases of the pair leads to currents in proportion to the emitter surfaces. Most often this systematic offset is not a problem as it is only the differences and not the absolute values that are of interest. In addition, this systematic offset does not play any part whatsoever in the dual differential pairs as it is naturally eliminated.

Figure 3:
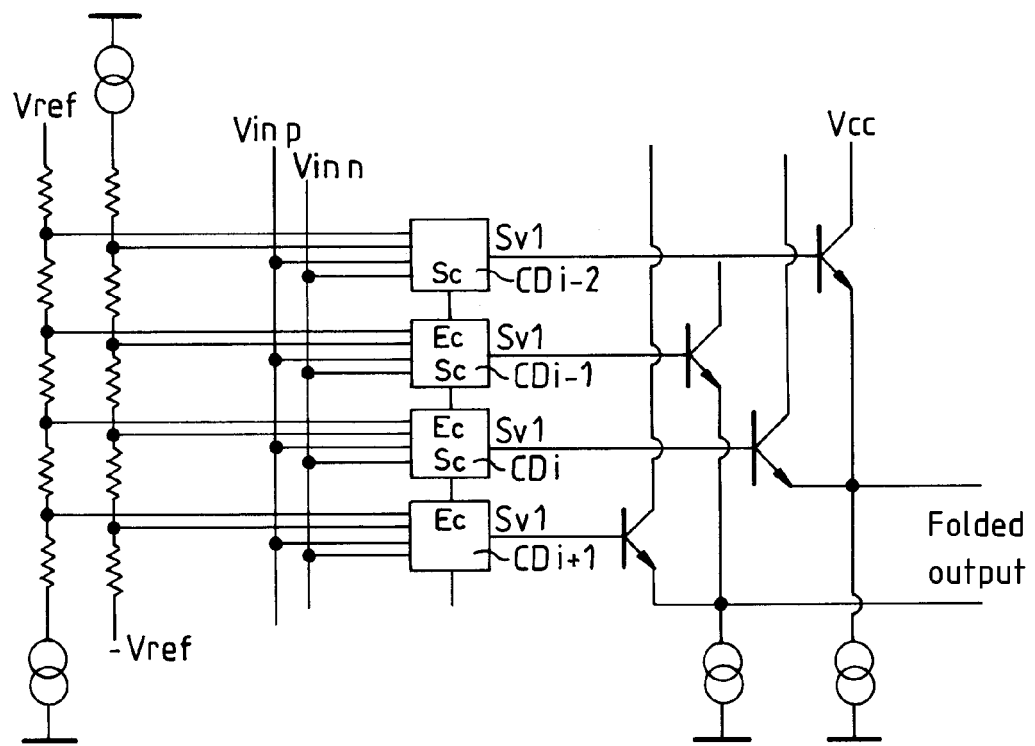
FIG. 3 represents a folding circuit application for an analog-to-digital converter.

FIG. 3 represents an application of the cell in FIG. 2 to the embodiment of a folding circuit in an analog-to-digital comparator.

Reference voltages are produced by two precision resistor bridges supplied by opposite voltages Vref and -Vref. Pairs of respective reference voltages sampled on the two bridges are applied to the transistors T2 and T4 of the different dual differential cells, which are designated by $CD_{i-2}$, $CD_{i-1}$, $CD_i$, $CD_{i+1}$ for the four adjacent cells shown.

All these cells further receive the voltage to be converted, in the form of a differential voltage Vinp, Vinn applied as previously explained to the bases of the transistors T1 and T3.

The current input Ec of a cell of rank i is connected to the current output Sc of the cell of rank i−1; the current output of the cell of rank i is connected to the current input of the cell i−1.

The voltage outputs Sv of the odd rank cells (i−1, i+1, etc.) are connected to an analog wired OR circuit, and the voltage outputs Sv of the even rank cells (i−2, i, i+2, etc.) are connected to another wired OR circuit. The outputs of these two wired OR circuits define a folded differential output capable of being used in a folding analog converter.

The wired OR circuits conventionally comprise two transistors having their collectors at a supply terminal, their emitters connected to a current source, their bases receiving the voltages Sv. The output of the wired OR is sampled on the joined emitters.

Figure 4:
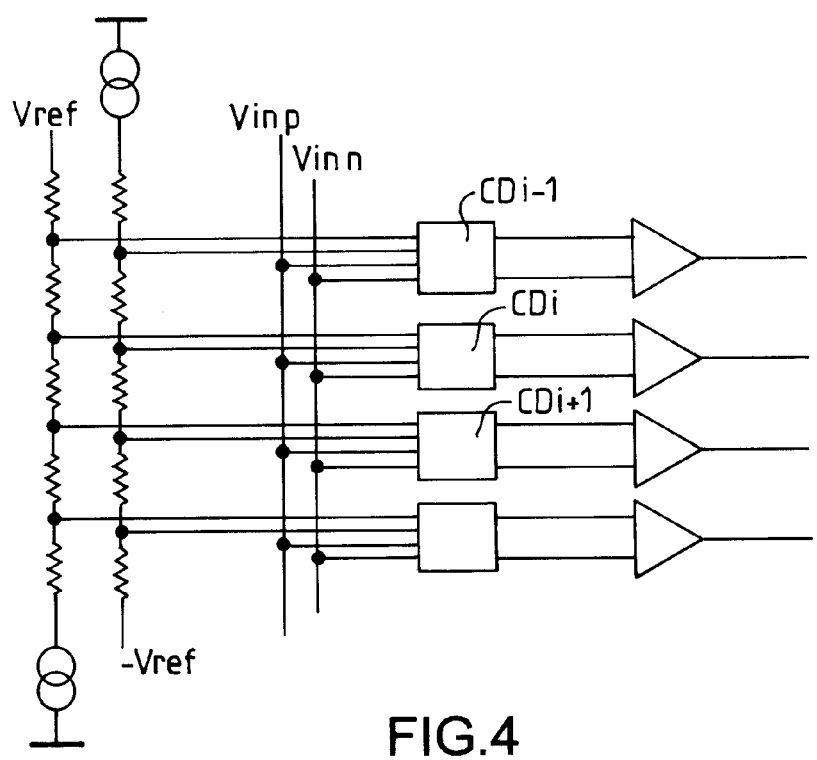
FIG. 4 represents an application for a flash type analog-to-digital converter.

FIG. 4 represents an application of dual differential pairs, according to the invention, to a flash type analog-to-digital converter: each dual differential pair such as those in FIGS. 1 and 2 forms a circuit with four inputs and two outputs and is followed by a comparator.

It will be readily seen by one of ordinary skill in the art that embodiments according to the present invention fulfill many of the advantages set forth above. After reading the foregoing specification, one of ordinary skill will be able to affect various changes, substitutions of equivalents and various other aspects of the invention as broadly disclosed herein. It is therefore intended that the protection granted hereon be limited only by the definition contained in the appended claims and equivalents thereof.

The invention claimed is:

1. An analog-to-digital converter, comprising:
   a dual differential pair each composed of two identical single differential pairs of two transistors, the dual differential pair receiving a differential input signal which is the difference between a first and a second variable voltage each applied respectively to a first respective transistor of each single pair, and further receiving a fixed reference signal applied to a second respective transistor of each single differential pair, each single pair being powered by a respective current source connected to emitters of the two transistors of the pair in such a way that the current from the source is shared between the emitters of the pair's transistors, wherein each of the two differential pairs, the transistor that receives a fixed reference voltage has an emitter surface at least twice as large as the transistor that receives a variable voltage at its base.

2. The analog-to-digital converter as claimed in claim 1, wherein the transistor that receives a fixed reference voltage has an effective emitter surface double the other.

3. The analog-to-digital converter as claimed in claim 2, wherein the transistor that receives a fixed reference voltage consists of two transistors in parallel, identical to the transistor that receives the variable voltage.

4. The analog-to-digital converter as claimed in claim 1, wherein the fixed reference signal is a differential signal, which is the difference between two reference voltages (Vrefp, Vrefn) applied respectively to the base of the second transistor of each of the pairs.

5. An application of the integrated circuit as claimed in claim 1 to an analog signal folding circuit with multiple differential pairs.

6. An application of the integrated circuit as claimed in claim 1 to a flash type analog-to-digital converter using dual differential pair comparators.

7. The analog-to-digital converter as claimed in claim 2, wherein the fixed reference signal is a differential signal, which is the difference between two reference voltages (Vrefp, Vrefn) applied respectively to the base of the second transistor of each of the pairs.

8. The analog-to-digital converter as claimed in claim 3, wherein the fixed reference signal is a differential signal, which is the difference between two reference voltages (Vrefp, Vrefn) applied respectively to the base of the second transistor of each of the pairs.

9. An application of the integrated circuit as claimed in claim 2 to an analog signal folding circuit with multiple differential pairs.

10. An application of the integrated circuit as claimed in claim 3 to an analog signal folding circuit with multiple differential pairs.

11. An application of the integrated circuit as claimed in claim 4 to an analog signal folding circuit with multiple differential pairs.

12. An application of the integrated circuit as claimed in claim 2 to a flash type analog-to-digital converter using dual differential pair comparators.

13. An application of the integrated circuit as claimed in claim 3 to a flash type analog-to-digital converter using dual differential pair comparators.

14. An application of the integrated circuit as claimed in claim 4 to a flash type analog-to-digital converter using dual differential pair comparators.

* * * * *